Figure 1:
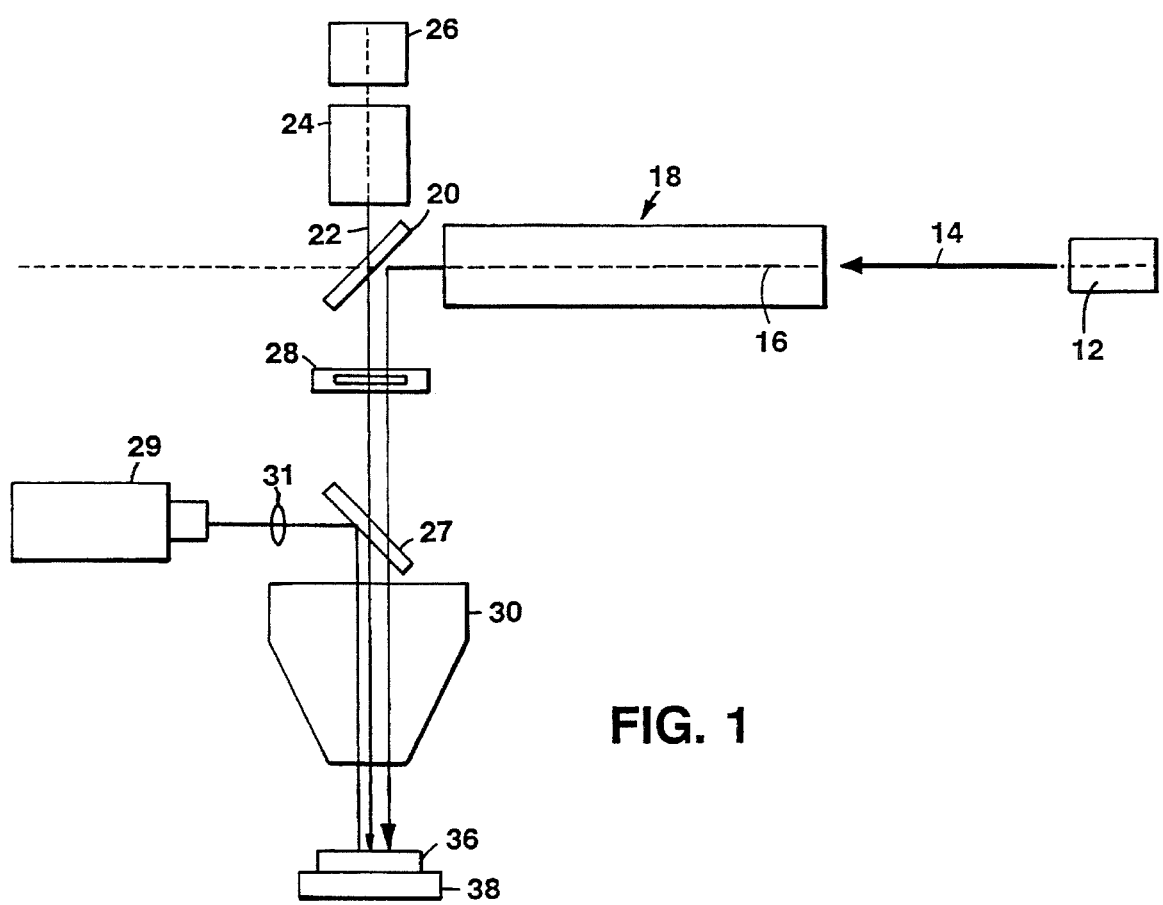

United States Patent [19]
Elliott et al.

[11] Patent Number: 5,488,229
[45] Date of Patent: Jan. 30, 1996

[54] DEEP ULTRAVIOLET MICROLITHOGRAPHY SYSTEM

[75] Inventors: David J. Elliott, Wayland, Mass.; David Shafer, Fairfield, Conn.

[73] Assignee: Excimer Laser Systems, Inc., Wayland, Mass.

[21] Appl. No.: 317,314

[22] Filed: Oct. 4, 1994

[51] Int. Cl.$^6$ .................................................. G21K 5/04
[52] U.S. Cl. ....................................................... 250/492.2
[58] Field of Search ........................ 250/492.2; 359/366

[56] References Cited

U.S. PATENT DOCUMENTS

| | | | |
|---|---|---|---|
| 4,747,678 | 5/1988 | Shafer et al. | 350/505 |
| 4,953,960 | 9/1990 | Williamson | 350/442 |
| 5,031,976 | 7/1991 | Shafer | 350/1.2 |
| 5,031,977 | 7/1991 | Gibson | 350/1.4 |
| 5,206,515 | 4/1993 | Elliott et al. | 250/492.2 |
| 5,212,593 | 5/1993 | Williamson et al. | 359/487 |
| 5,220,454 | 6/1993 | Ichihara et al. | 359/487 |
| 5,241,423 | 8/1993 | Chiu et al. | 359/727 |
| 5,251,070 | 10/1993 | Hashimoto et al. | 359/732 |

FOREIGN PATENT DOCUMENTS

4203464A1  2/1992  Germany .

OTHER PUBLICATIONS

Bingham et al., "The Priciples of Aberration-Corrected Optical Systems", *SPIE*, vol. 654, (1985), pp. 88–93.

*Primary Examiner*—Jack I. Berman
*Attorney, Agent, or Firm*—Fish & Richardson

[57] ABSTRACT

A high resolution, deep UV photolithography system includes a deep UV radiation source for generating a beam of narrow wavelength deep ultraviolet radiation along a path, mask receiving structure in the path, a first optical system in the path for homogenizing and shaping the deep UV energy in the path; and a second optical system in the path for directing radiation energy onto the surface of a substrate to be processed, the second optical system including large area mirror structure having a numerical aperture of at least 0.3 and a plurality of refractive elements disposed between the mask receiving structure and the substrate for compensating (reducing) image curvature introduced into the system by the large area mirror structure.

19 Claims, 2 Drawing Sheets

DEEP ULTRAVIOLET MICROLITHOGRAPHY SYSTEM

This invention relates to high resolution deep ultraviolet photolithography systems for exposing material surfaces to a high energy deep ultraviolet radiation.

The processing of very high density integrated circuits requires high resolution systems capable of resolving and exposing portions of the circuit substrate, with the use of a mask in the optical path. In the process of making advanced integrated circuits, it is conventional to transfer a circuit pattern image from a mask or reticle onto a layer of photosensitive material called photoresist. The wavelengths used in optical lithography onto silicon wafers have gone from 436 nanometers (G line) to 365 nanometers (I line) using mercury lamp sources. Future wavelengths include 248 nanometers from a krypton fluoride excimer laser (or 250 nanometers from an intense mercury lamp) 213 nanometers from a solid state (5xYAG) laser and 193 nanometer from an argon fluoride excimer laser.

In accordance with one aspect of the invention, there is provided a high resolution, deep UV photolithography system for exposing a surface, directly or through a mask, the photolithography system including a deep UV radiation source for generating a beam of narrow wavelength deep ultraviolet radiation along a path, a first optical system in the path for homogenizing and shaping the deep UV energy in the path; mask receiving structure in said path; and a second optical system in the path for directing radiation energy onto the surface of a substrate to be processed, the second optical system including large area mirror structure having a numerical aperture of at least 0.3 and a plurality of refractive elements disposed between said mask receiving structure and said substrate for compensating (reducing) image curvature introduced into the system by the large area mirror structure.

Preferably, the deep UV radiation source is an excimer or other laser of wavelength in the 150–250 nanometer range (although it will be appreciated that other types of deep UV sources such as gas fill lamps and microwave energized sources may be employed in particular embodiments). The large area mirror structure includes first mirror structure that is disposed on the system axis, and second mirror structure of concave spherical configuration with an aperture portion disposed on the system axis for passing a beam of radiation to the first mirror structure.

In a preferred embodiment, the optical compensation assembly includes a distributed array of refractive elements designed for a particular wavelength.

The system provides a microlithography system with a numerical aperture (N.A.) of at least 0.3 with a pair of reflective elements and a group of refractive elements with substantial positive power (which flattens the field distorted by the spherical mirror). The system preferably allows the operator to view the imaging process at a visible 633 nanometer wavelength while the substrate processing operative at a wavelength such as 193 nanometers or 248 nanometers is in progress.

In accordance with one aspect of the invention, the optical system relies principally on mirrors to transmit the integrated circuit pattern information from the mask or reticle to the photoresist coated silicon wafer or other substrate with refractive elements (all made of the same refractive material—fused silica) to compensate for field curvature produced by the mirror structure, as well as other aberrations introduced into the system. The invention provides improved performance in the form of a very flat field, necessary for microlithography, as well as giving a high numerical aperture (or fast speed of the lens) of 0.6 N.A. The correcting refractive elements have substantial positive power (which flattens the field). The image formed by the two mirrors thus is essentially completely flattened just before it reaches the photoresist coated wafer where the aerial image is translated into a latent image in the photoresist coating. Having strong lens power would normally cause substantial chromatic (or color) variations in aberrations, as well as both longitudinal chromatic focus shift (each change in wavelength or color would have a corresponding change in the location of focus of the image).

In a particular embodiment, such aberrations are corrected and a broad deep ultraviolet spectral region can be imaged with diffraction-limited performance, by using only fused silica lenses. Normally, color correction is made by using two different types of glass such as flint glass and crown glass, each with different refraction characteristics. Another way to correct for color aberrations in the deep ultraviolet is to use calcium fluoride or magnesium fluoride lens elements. These types of elements have problems of poor homogeneity (material inconsistency), cannot be easily polished or fabricated (not hard enough) into high quality surfaces, and add complexity to the design by adding several additional optical elements. Color correction is achieved in a particular embodiment by using shaped refractive elements, and all the image correcting (refractive) elements are made of the same material (fused silica).

Conventional deep-UV lenses are of the all-refractive type (no mirrors). They require that the light source be highly spectrally narrowed, down to less than one picometer. The result of this spectral narrowing is loss of 80–90 percent or more of the light energy. Such 'line-narrowed' laser exposure systems, currently experimental for 248 nanometers and 193 nanometers lithography, have very low wafer exposure throughput, a key parameter in IC manufacturing economics. The mirror-based catadioptric embodiment of the invention allows for unnarrowed laser light, and uses most of the available power.

Figure 2:
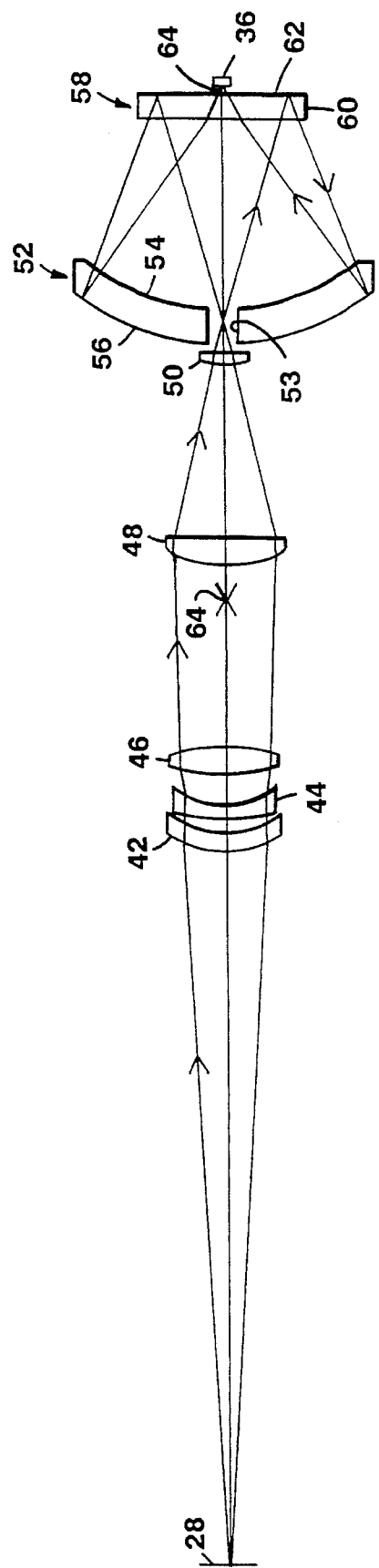

Other features and advantages of the invention will be seen as the following description of a particular embodiment progresses, in conjunction with the drawings, in which:

FIG. 1 is a diagram of a microlithography system in accordance with the invention; and FIG. 2 is a diagram of imaging optics employed in the system shown in FIG. 1.

DESCRIPTION OF PARTICULAR EMBODIMENT

With reference to FIG. 1, the system includes twenty watt argon fluoride excimer laser source 12 that generates deep UV (193 nanometer) radiation in a beam 14 along axis 16 for passage through illumination optics 18 for impingement on beam splitter mirror 20.

Disposed along axis 22, that is orthogonal to axis 16, is a viewing port diagrammatically indicated at 29 illuminated by tungsten lamp 26. The radiation on axis 16 is reflected by beam splitter mirror 20 for passage along beam axis 22 and through reticle or mask 28 with a pattern of lines of about one micron width is disposed.

The deep UV radiation emerging from mask 28 passes through beam splitter 27 and through compensated 10X reduction optical system 30 that has a numerical aperture of 0.6 for imaging a 10:1 or other optical reduction ratio such as 5:1 or 20:1 image of mask 28 on UV sensitive wafer target structure 36 that is supported on adjustable stage 38. Video camera 29 monitors the photo lithography process, and optical correction lens 31 compensates for the focus shift change between the exposing radiation wavelength from laser source 12 and the viewing radiation from tungsten lamp 26. That is, because the UV energy is in focus at the target structure 36 and the viewing energy is out of focus at the target structure 36, lens 31 is provided to, in effect, focus the camera 29 at the target structure 36.

Optical system 30 includes refractive lenses 42, 44, 46, 48, 50; optical component 52 that includes aperture 53, lens component 54 and a spherical reflective surface 56 and optical component 58 that includes lens component 60 and mirror 62 with a central clear area (non-reflective) portion 64 through which radiation passes for impingement on wafer target structure 36. Each lens has leading surface A and trailing surface B (see the following table).

Specific values of optical components 42–62 are set out in the following table:

| Surface | Radius (millimeter) | Spacing (millimeter) | Material |
| --- | --- | --- | --- |
| Mask 28 | — | 267.2 | Air |
| 42A | 33.95 | 7.00 | Fused Silica |
| 42B | 37.68 | 5.00 | Air |
| 44A | 87.99 | 5.00 | Fused Silica |
| 44B | 33.36 | 12.17 | Air |
| 46A | 82.07 | 7.00 | Fused Silica |
| 46B | −251.23 | 71.35 | Air |
| 48A | 47.92 | 9.00 | Fused Silica |
| 48B | — | 68.02 | Air |
| 50A | 23.61 | 3.00 | Fused Silica |
| 50B | 190.05 | 87.26 | Air |
| 60A | — | 8.00 | Fused Silica |
| 60R | 1180.56 | −8.00 | Reflector |
|  | — | −70.98 | Air |
| 54A | 82.97 | −11.00 | Fused Silica |
| 56R | 105.25 | 11.00 | Reflector |
| 54A | 82.97 | 70.98 | Air |
| 60A | — | 8.00 | Fused Silica |
| 60B | 1180.56 | 2.75 | Air |
| Wafer 36 | — | — |  |

In the optical system shown in FIG. 2, lenses 42, 44 and 46 provide compensation for aberrations such as coma, astigmatism and chromatic variations, lens 48 provides focusing, lens 50 is a field lens, and lenses 54 and 60 provides field flattening. Lens-mirror combinations 52 and 58 provide compensation for primary and secondary and tertiary color, respectively. An aperture stop or iris is at 64.

While a particular embodiment of the invention has been shown and described, various modifications will be apparent to those skilled in the art, and therefore, it is not intended that the invention be limited to the disclosed embodiment, or to details thereof, and departures may be made therefrom within the spirit and scope of the invention.

What is claimed is:

1. A high resolution, deep UV beam photolithography system comprising a deep UV radiation source for generating a beam of deep ultraviolet radiation along a path, mask receiving structure in said path, a first optical system in said path for homogenizing and shaping the deep UV energy in said path; and a second optical system in said path for directing radiation energy onto the surface of a substrate to be processed, said second optical system including large area mirror structure having a numerical aperture of at least 0.3 and a plurality of refractive elements disposed between said mask receiving structure and said substrate for compensating (reducing) image curvature introduced into the system by said large area mirror structure, said second optical system providing a focal point outside any one of said refractive elements.

2. The system of claim 1 wherein all of the refractive elements in said second optical system are of fused silica.

3. The system of claim 1 wherein said deep UV radiation source is a laser of wavelength in the 150–250 nanometer range.

4. The system of claim 1 wherein said large area mirror structure includes a first mirror that is disposed on the system axis and a second mirror of concave spherical configuration with an aperture portion disposed on said beam path for passing a beam of radiation to said first mirror.

5. The system of claim 4 wherein each of said mirrors is mounted on a refractive lens component and includes a clear region on said beam path.

6. The system of claim 1 wherein said system is a microlithography system with a numerical aperture of about 0.6.

7. The system of claim 1 wherein said second optical system includes a plurality of lens elements (42–50) and first and second lens-mirror combinations (54, 56; 60, 62) that have the following dimensional values:

| Surface | Radius (millimeter) | Spacing (millimeter) |
| --- | --- | --- |
| Mask 28 | — | 267.2 |
| 42A | 33.95 | 7.00 |
| 42B | 37.68 | 5.00 |
| 44A | 87.99 | 5.00 |
| 44B | 33.36 | 12.17 |
| 46A | 82.07 | 7.00 |
| 46B | −251.23 | 71.35 |
| 48A | 47.92 | 9.00 |
| 48B | — | 68.02 |
| 50A | 23.61 | 3.00 |
| 50B | 190.05 | 87.26 |
| 60A | — | 8.00 |
| 62R | 1180.56 | −8.00 |
|  | — | −70.98 |
| 54A | 82.97 | −11.00 |
| 56R | 105.25 | 11.00 |
| 54A | 82.97 | 70.98 |
| 60A | — | 8.00 |
| 60B | 1180.56 | 2.75 |
| Wafer 36 | — | —. |

8. The system of claim 1 and further including optics for allowing an operator to view the imaging process in focus at a visible wavelength while substrate processing at an ultraviolet wavelength is in focus and is in progress.

9. The system of claim 1 wherein said refractive elements provide field flattening improvement of at least five times.

10. The system of claim 9 wherein all of the refractive elements in said second optical system are of fused silica.

11. The system of claim 9 wherein said deep UV radiation source is a laser of wavelength in the 150–250 nanometer range.

12. The system of claim 9 wherein said large area mirror structure includes a first mirror that is disposed on the system axis and a second mirror of concave spherical configuration with an aperture portion disposed on said beam path for passing a beam of radiation to said first mirror.

13. The system of claim 12 wherein said second mirror is mounted on a refractive lens component and includes a clear region on said beam path.

14. The system of claim 13 wherein said second optical system includes a plurality of lens elements (42–50) and first and second lens-mirror combinations (54, 56; 60, 62) that have the following dimensional values:

| Surface | Radius (millimeter) | Spacing (millimeter) |
|---|---|---|
| Mask 28 | — | 267.2 |
| 42A | 33.95 | 7.00 |
| 42B | 37.68 | 5.00 |
| 44A | 87.99 | 5.00 |
| 44B | 33.36 | 12.17 |
| 46A | 82.07 | 7.00 |
| 46B | −251.23 | 71.35 |
| 48A | 47.92 | 9.00 |
| 48B | — | 68.02 |
| 50A | 23.61 | 3.00 |
| 50B | 190.05 | 87.26 |
| 60A | — | 8.00 |
| 62R | 1180.56 | −8.00 |
|  | — | −70.98 |
| 54A | 82.97 | −11.00 |
| 56R | 105.25 | 11.00 |
| 54A | 82.97 | 70.98 |
| 60A | — | 8.00 |
| 60B | 1180.56 | 2.75 |
| Wafer 36 | — | —. |

15. The system of claim 1 and further including optics for allowing an operator to view the imaging process in focus at a visible wavelength while substrate processing at an ultraviolet wavelength is in focus and is in progress.

16. For use in a deep ultraviolet microlithography system
   a reflective imaging system comprising first and second mirrors, at least fifty percent of the magnification or imaging power on the fast speed end of the system being provided by said mirrors, and
   field flattening and aberration compensation structure including an array of lens elements, said array of lens elements all being formed from the same refractive material type and providing a focal point outside of said array of lens elements,
   comprising a first plurality of lens elements disposed at a first predetermined position along an optical path of said imaging system for providing aberration compensation,
   a second lens element disposed at a second predetermined position along said optical path subsequent to said first lens element, said second lens element being operative to act in conjunction with said mirrors to provide field flattening, and
   a supplemental lens element disposed at a third predetermined position along said optical path for providing color compensation.

17. The system of claim 16 wherein said same refractive material type is fused silica.

18. The system of claim 16 wherein said imaging system and said compensation structure includes a plurality of lens elements (42–50) and first and second lens-mirror combinations (54, 56; 60, 62) that have the following dimensional values:

| Surface | Radius (millimeter) | Spacing (millimeter) |
|---|---|---|
| Mask 28 | — | 267.2 |
| 42A | 33.95 | 7.00 |
| 42B | 37.68 | 5.00 |
| 44A | 87.99 | 5.00 |
| 44B | 33.36 | 12.17 |
| 46A | 82.07 | 7.00 |
| 46B | −251.23 | 71.35 |
| 48A | 47.92 | 9.00 |
| 48B | — | 68.02 |
| 50A | 23.61 | 3.00 |
| 50B | 190.05 | 87.26 |
| 60A | — | 8.00 |
| 62R | 1180.56 | −8.00 |
|  | — | −70.98 |
| 54A | 82.97 | −11.00 |
| 56R | 105.25 | 11.00 |
| 54A | 82.97 | 70.98 |
| 60A | — | 8.00 |
| 60B | 1180.56 | 2.75 |
| Wafer 36 | — | —. |

19. The system of claim 17 wherein each of said first and second mirrors is mounted on refractive lens components.

* * * * *